(12) United States Patent
Chuang et al.

(10) Patent No.: US 12,336,277 B2
(45) Date of Patent: Jun. 17, 2025

(54) FIN FIELD-EFFECT TRANSISTOR (FINFET) WITH A HIGH-K MATERIAL FIELD-PLATING

(71) Applicant: TEXAS INSTRUMENTS INCORPORATED, Dallas, TX (US)

(72) Inventors: Ming-Yeh Chuang, McKinney, TX (US); Umamaheswari Aghoram, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 781 days.

(21) Appl. No.: 17/458,122

(22) Filed: Aug. 26, 2021

(65) Prior Publication Data

US 2023/0067590 A1  Mar. 2, 2023

(51) Int. Cl.
| | | |
|---|---|---|
| *H10D 30/62* | (2025.01) | |
| *H10D 30/01* | (2025.01) | |
| *H10D 64/00* | (2025.01) | |
| *H10D 84/01* | (2025.01) | |
| *H10D 84/03* | (2025.01) | |
| *H10D 84/83* | (2025.01) | |

(52) U.S. Cl.
CPC ......... *H10D 84/834* (2025.01); *H10D 30/024* (2025.01); *H10D 30/6211* (2025.01); *H10D 64/111* (2025.01); *H10D 84/013* (2025.01); *H10D 84/0158* (2025.01); *H10D 84/038* (2025.01)

(58) Field of Classification Search
None
See application file for complete search history.

(56) References Cited

U.S. PATENT DOCUMENTS

2014/0183629 A1*  7/2014  Meiser ................ H01L 29/7816
                                                              438/286
2017/0358651 A1* 12/2017  Lu ........................ H01L 29/454

* cited by examiner

*Primary Examiner* — Joseph C. Nicely
*Assistant Examiner* — Lamont B Koo
(74) *Attorney, Agent, or Firm* — Yudong Kim; Frank D. Cimino (57) ABSTRACT

One example includes an integrated circuit (IC) comprising a fin field effect transistor (FinFET). The FinFET includes a substrate with a fin extending from a surface of the substrate. The fin includes a source region, a drain region, and a drift region adjacent the drain region. The fin also includes a field-plating (FP) dielectric layer on a first side, a second side, and a third side of the drift region. The FP dielectric layer includes a high-K material.

21 Claims, 6 Drawing Sheets

FIN FIELD-EFFECT TRANSISTOR (FINFET) WITH A HIGH-K MATERIAL FIELD-PLATING

TECHNICAL FIELD

This description relates to electronic circuits, and particularly a FinFET with a high-K material field-plating.

BACKGROUND

Field effect transistors (FETs) can be formed in a variety of ways to serve a variety of purposes for integrated circuits and other devices. FETs are formed as "planar" devices in some integrated circuits, as devices in which the conduction channel has width and length extending in a direction parallel to the major surface of a substrate. FETs can be formed in a silicon-on-insulator (SOI) layer of a substrate or in a bulk silicon substrate.

FETs having a non-planar conduction channel may also be fabricated. In such non-planar FETs either the length or the width of the transistor channel is oriented in the vertical direction, that is, in a direction perpendicular to the major surface of the substrate. These types of FETs have one or more channel ridges formed between one or more trenches. In one such type of device, commonly referred to as the fin field effect transistor (FinFET), the width of the conduction channel is oriented in the vertical direction, while the length of the channel is oriented parallel to the major surface of the substrate. With such orientation of the channel, FinFET can be constructed to have a larger width conduction channel than planar FETs so as to produce larger current drive than planar FETs which occupy the same amount of integrated circuit area (the area parallel to the major surface of the substrate).

SUMMARY

One example includes an integrated circuit (IC) comprising a fin field effect transistor (FinFET). The FinFET includes a substrate with a fin extending from a surface of the substrate. The fin includes a source region, a drain region, and a drift region adjacent the drain region. The fin also includes a field-plating (FP) dielectric layer on a first side, a second side, and a third side of the drift region. The FP dielectric layer includes a high-K material.

Another example includes a method for fabricating an IC comprising a FinFET.

The method includes forming a fin on a semiconductor surface of a silicon substrate and forming a dielectric layer on the fin. The dielectric layer includes a high-K material. The method further includes etching the dielectric layer to form an FP dielectric layer on a first side, a second side, and a third side of a drift region of the fin, and forming a field-plate on the FP dielectric layer.

Another example includes an IC comprising a FinFET. The FinFET includes a substrate and a fin extending from a surface of the substrate. The fin includes a source region, a drain region, a drift region adjacent the drain region, and a body region adjacent to the drift region and the source region. The FinFET also includes an FP dielectric layer on a first side, a second side, and a third side of the drift region. The FP dielectric layer includes a high-K material. The FinFET further includes an oxide material layer on a first side, a second side, and a third side of the body region.

BRIEF DESCRIPTION OF THE DRAWINGS

For a detailed description of various examples, reference will now be made to the accompanying drawings in which.

DETAILED DESCRIPTION

This description relates to electronic circuits, and particularly a FinFET with a high-K material field-plating.

Gate field-plating is used in planar transistors to increase drain breakdown voltage and reduce leakage current. The fin field effect transistors (FinFETs) disclosed herein include field-plating formed on three sides of the fin. More specifically, the field-plating is provided on three sides of a drift region of the fin. As used herein, the term "high-K" refers to a dielectric constant greater than that of silicon dioxide and as described herein, the field-plating includes a high-K material (e.g., a high-K material layer) that can facilitate a lower specific on-resistance (RSP) relative to a typical FinFET that includes an oxide-only field-plating layer without affecting a breakdown voltage of the FinFET described herein. A method for fabricating the FinFET with the high-K material field-plating is disclosed.

Figure 1:
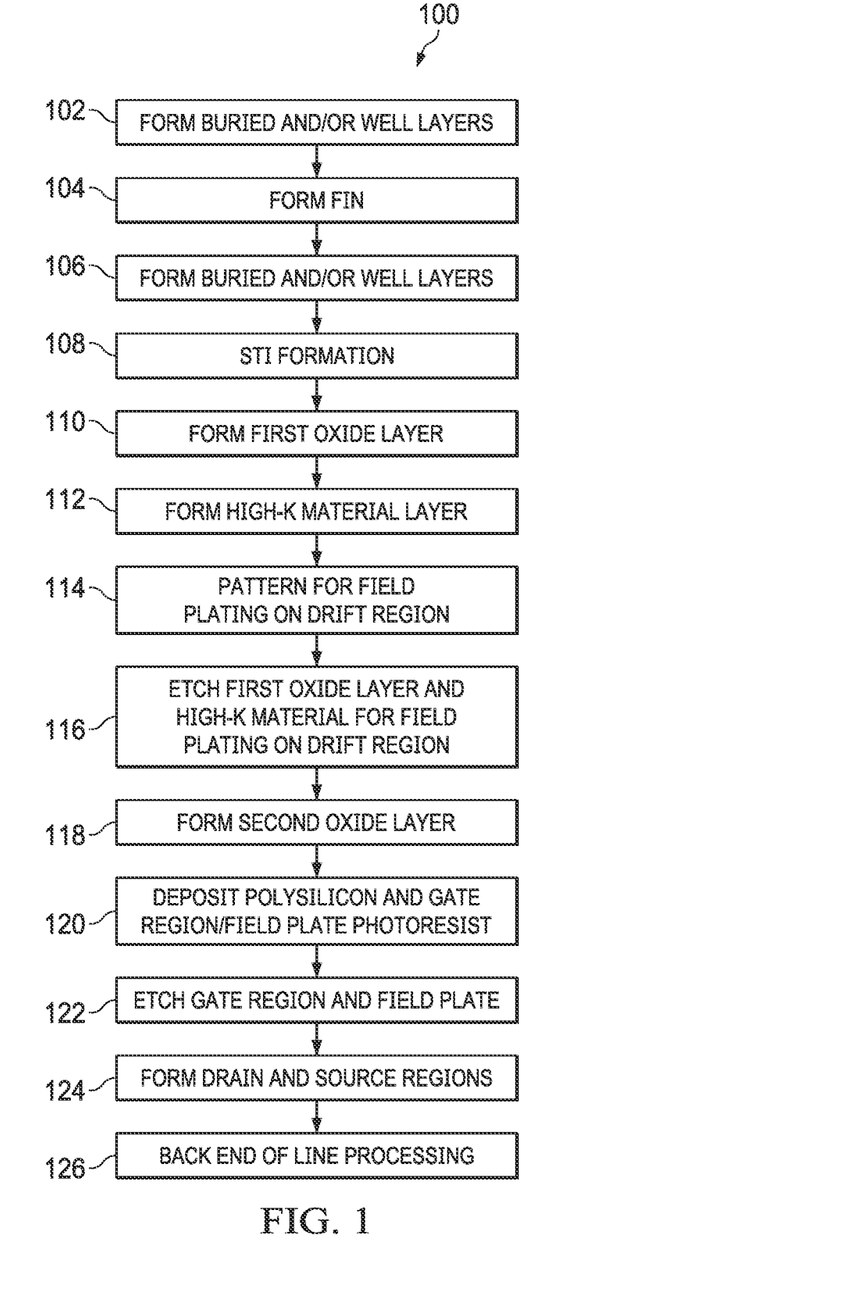
FIG. 1 shows a flow diagram for an example method for fabricating a fin field effect transistor (FinFET) that includes field-plating.

FIG. 1 shows a flow diagram for an example method 100 for fabricating an integrated circuit having a fin field effect transistor (FinFET) that includes field-plating in accordance with the present disclosure. Though depicted sequentially as a matter of convenience, at least some of the actions shown can be performed in a different order and/or performed in parallel. Additionally, some implementations may perform only some of the actions shown.

In block 102, buried and/or well layers are formed in a substrate. The substrate may be bulk silicon, silicon-on-insulator (SOI), silicon-germanium, gallium arsenide, etc. In one example, a reduced surface field (RESURF) layer is formed on the oxide layer of an SOI substrate. In another example, an N-type layer is formed in a bulk silicon substrate and a RESURF layer is formed on the N-type layer.

Figure 2:
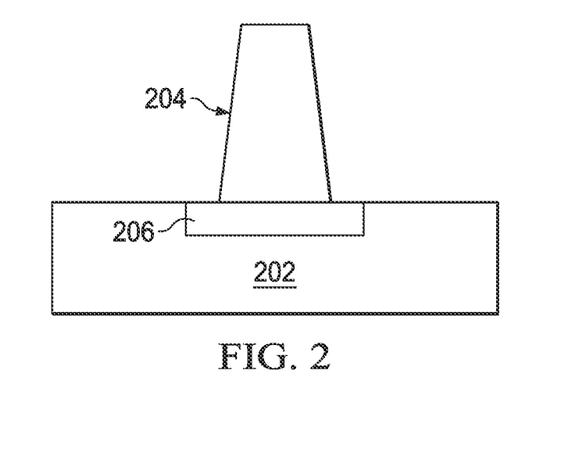
FIG. 2 shows an example fin formed on a substrate.

In block 104, a fin is formed on the substrate. The fin may be formed by etching the substrate to create a fin of the substrate material. In some implementations of the method 100, an epitaxial layer (e.g., monocrystalline silicon) is grown on the substrate after buried and/or well layers are formed in block 102, and the epitaxial layer is etched to form a fin. While a single fin is referenced herein as a matter of clarity, in practice, any number of fins may be formed. FIG. 2 shows an example fin 204 formed on a substrate 202 and a RESURF layer 206 disposed below the fin 204. An example fin may have a width of about 0.15 micrometers and a height of about 0.4 micrometers.

In block 106, additional buried and/or well structures are formed. For example, impurities may be added to the silicon of the fin to adjust the threshold voltage or other parameters of the FinFET. In some implementations of the method 100, an N-type drift layer may be formed on a portion of the fin 204 to improve drain breakdown voltage in the FinFET, and/or a RESURF layer may be formed by implantation at the base of the fin 204.

Figure 3:
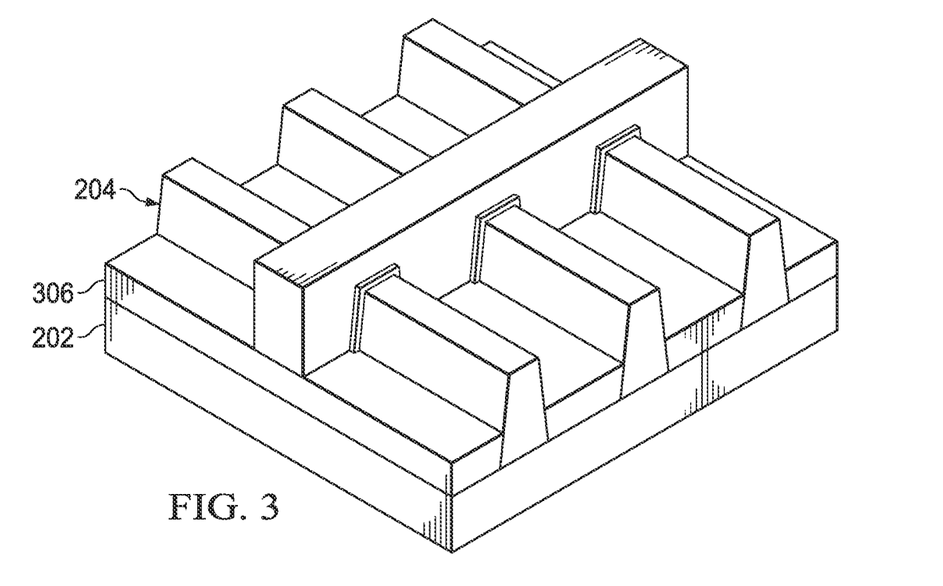
FIG. 3 shows an example of shallow trench isolation applied to the substrate about a fin.

In block 108, a shallow trench isolation (STI) formed on the substrate 202. The STI isolates the gate region, formed at block 122, as described in greater detail herein, from the substrate 202. STI formation can include depositing a dielectric material, such as silicon dioxide, on the substrate 202 to fill a space about the fin 204, and etching the dielectric material to a desired thickness, thereby exposing a desired height of the fin 204. FIG. 3 shows STI 306 applied to the substrate 202 about the fin 204.

In block 110, a first oxide layer is formed on the fin 204 and the STI 306. The first oxide layer may be any of a variety of dielectric layers, such as silicon dioxide, and can have a thickness of less than about 200 angstroms in some implementations.

Figure 4:
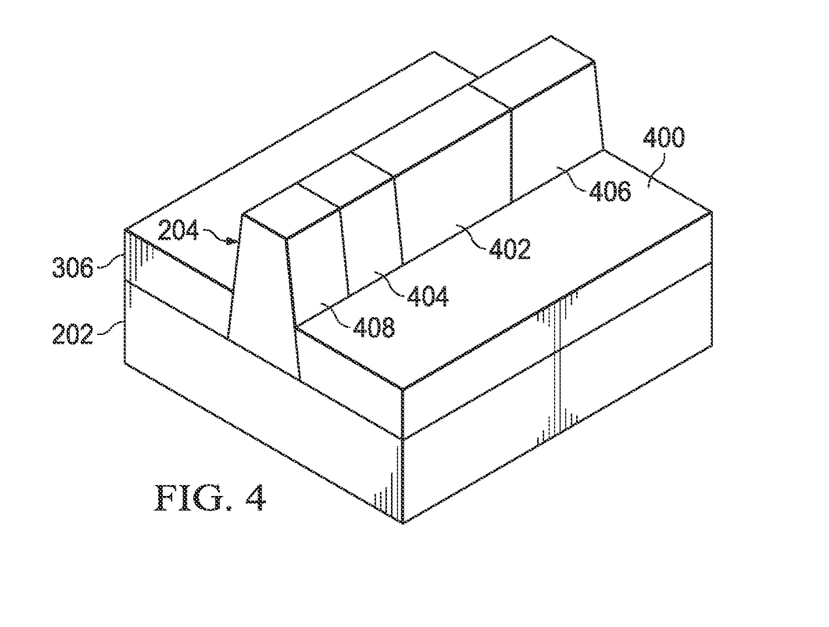
FIG. 4 shows an example drift region and body region of a fin.

In block 112, a high-K material layer is applied over the first oxide layer formed in block 110. As an example, the high-K material layer can be formed from any of a variety of high-K materials, such as nitride. The high-K material layer can have a thickness that is greater than the thickness of the first oxide material layer formed in block 110, as described in greater detail herein. In block 114, a layer of photoresist material is applied over the high-K material layer formed in block 112. The photoresist material patterns the first oxide material layer and the high-K material layer for creation of a field-plating dielectric layer on the drift region of the fin 204. FIG. 4 shows an example drift region 402 and body region 404 of the fin 204. The drift region 402 is adjacent the drain region 406 and the body region 404. The body region 404 is adjacent the source region 408 and the drift region 402.

Figure 5:
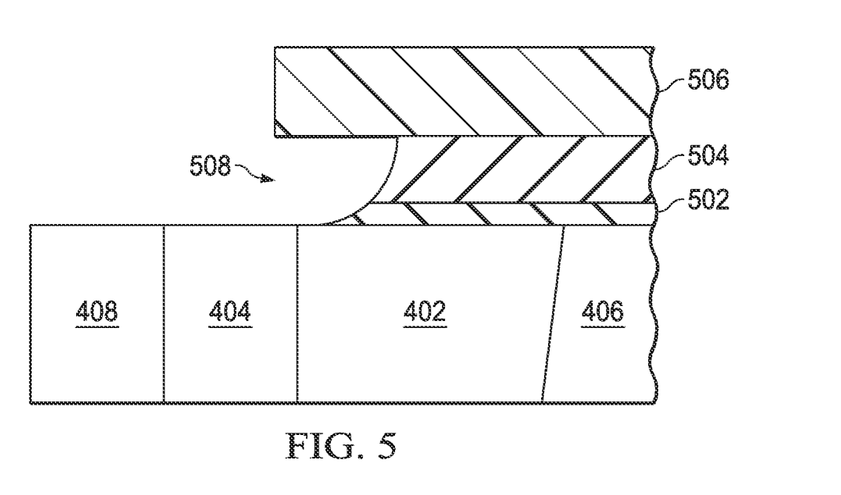
FIG. 5 shows a cross-sectional view of an example fin with a first oxide layer, a High-K material layer, and a photoresist layer after etching and before removal of the photoresist layer.

In block 116, the first oxide material layer formed in block 110 and the high-K material layer formed in block 112 are etched to create a portion of a field-plating dielectric (a portion of a field-plating dielectric layer) on the drift region 402 of the fin 204. For example, the first oxide layer and the high-K material layer are each removed from all surfaces of the fin 204 except surfaces of the drift region 402. Wet etching may be applied to remove the first oxide layer and the high-K material layer. The etching of the first oxide layer and the high-K material layer can be performed in separate etching processes, such that the high-K material layer is etched first in the field-plating pattern, followed by the first oxide material layer being etched in the field-plating pattern. FIG. 5 shows a cross-sectional view of the first oxide layer 502, the high-K material layer 504, and the photoresist layer 506 on the fin 204 after etching and before removal of the photoresist layer 506. The undercut 508 produced by the etching creates a smooth corner that increases breakdown voltage, relative to a sharp corner (e.g., 90°) that increases electric field and decreases breakdown voltage.

Figure 6:
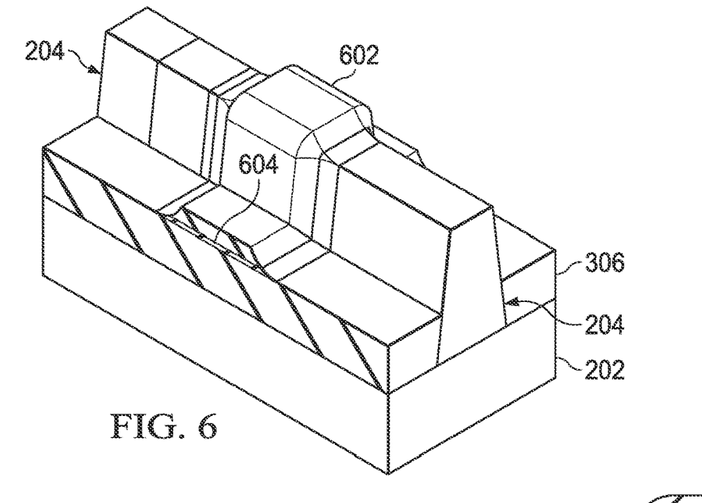
FIG. 6 shows a perspective view of the example fin with the first oxide material layer and the high-K material layer etched in the field-plating pattern.
Figure 7:
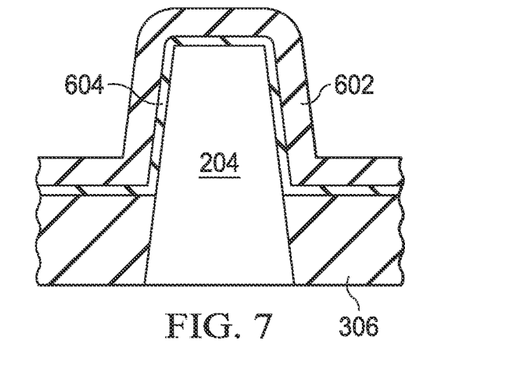
FIG. 7 shows a cross-sectional view of the example fin along the drift region.

FIG. 6 shows a perspective view of the example fin with the first oxide material layer and the high-K material layer etched in the field-plating pattern. The high-K material layer 602 overlies the first oxide material layer 604 on three-sides of the drift region 402 of the fin 204. The high-K material layer 602 and the first oxide material layer 604 therefore constitute a portion of the resultant field-plating dielectric layer, as described in greater detail herein. The remaining portions of the fin 204 are exposed at this stage of fabrication of the FinFET. FIG. 7 shows a cross-sectional view of the example fin 204 along the drift region 402. The cross-sectional view of FIG. 7 provides a better view of the high-K material layer 602 overlying the oxide material layer 604 on the three-sides of the drift region 402 of the fin 204.

Figure 8:
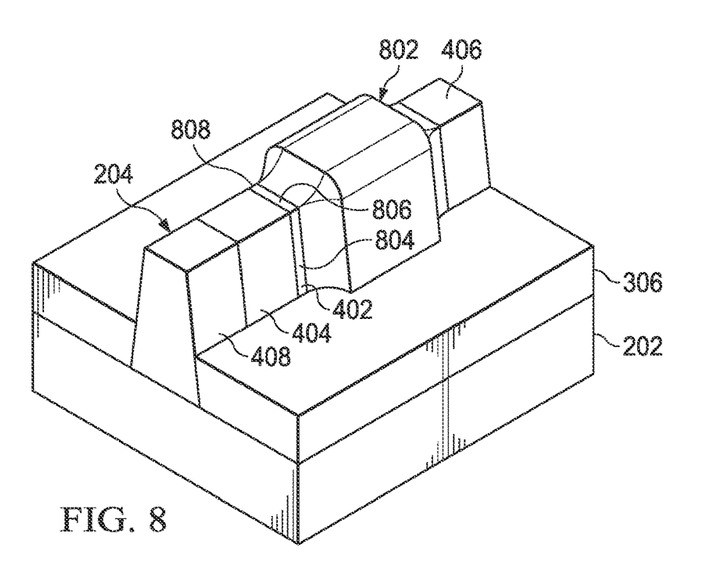
FIG. 8 shows an example of field-plating formed on a drift region of a fin.
Figure 9:
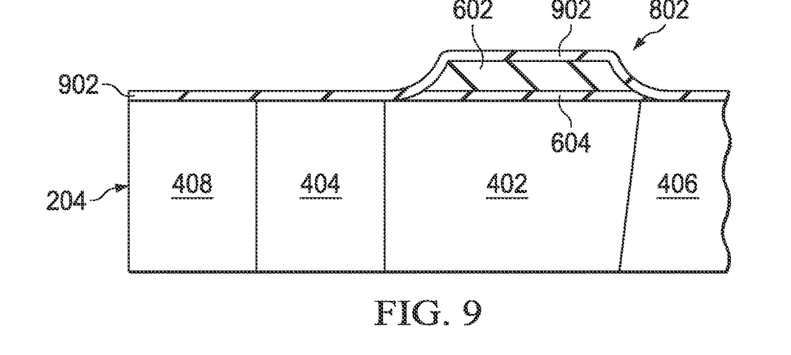
FIG. 9 shows a cross-sectional view of an example fin with the second oxide layer and the field-plating.

In block 118, a second oxide layer is formed (e.g., grown) on the fin 204 and the STI 306. The second oxide layer may be the same material as the first oxide layer (e.g., silicon dioxide), and can have a same or similar thickness of the first oxide layer (e.g., less than about 200 angstroms) in some implementations. For example, the second oxide layer formed in block 116 may be about 120 angstroms thick for a 5-volt gate oxide, and about 80 angstroms thick for a 3-volt gate oxide. The growth of the second oxide layer over the high-K material layer thus forms the complete field-plating dielectric layer over the drift region 402 of the fin 204. FIG. 8 shows a plan-view of the field-plating dielectric layer 802 formed on the drift region 402 of the fin 204. The field-plating dielectric 802 is formed on three sides (side 804, side 806, and side 808) of the drift region 402. Side 808 is opposite side 804. FIG. 9 shows a cross-sectional view of the second oxide layer 902 and the field-plating dielectric 802 formed on the fin 204, including the first, second, and sides of the body region 404. The example of FIG. 9 demonstrates that the field-plating dielectric 802 is formed from the first oxide layer 604, the high-K material layer 602, and the second oxide layer 902. The second oxide layer 902 is therefore both adjacent to and can be a part of the field-plating dielectric 802.

Figure 10:
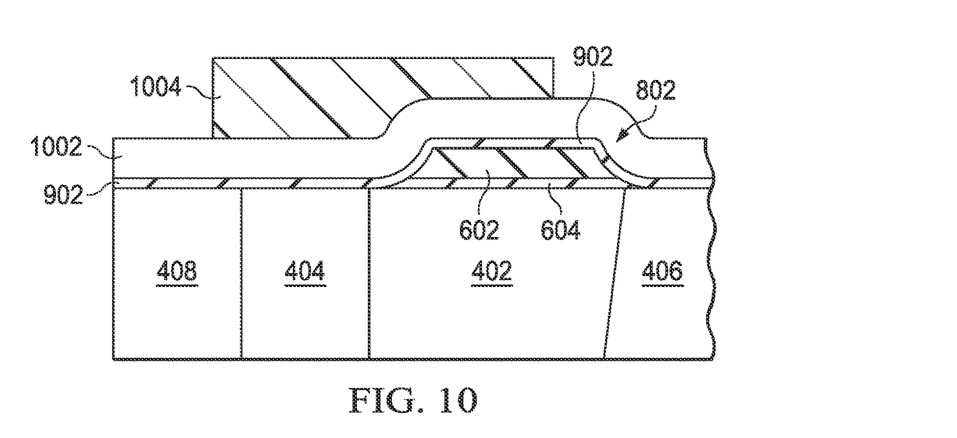
FIG. 10 shows a perspective view of an example fin with second oxide layer and field-plating.
Figure 11:
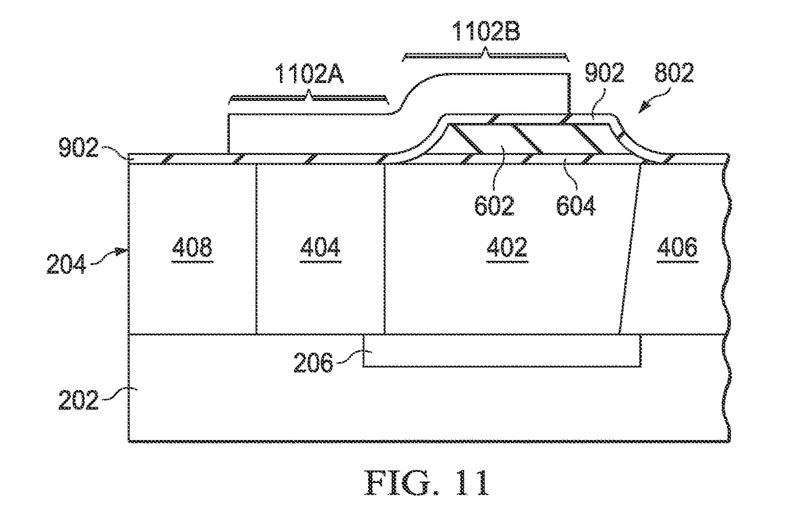
FIG. 11 shows a cross-sectional view of an example fin with a gate region formed over a second oxide layer and a portion of field-plating.

In block 120, a conductive layer, such as polysilicon, is deposited on the second oxide layer 902 of the fin 204, including on at least a portion of the field-plating dielectric 802 of the fin 204. A layer of photoresist material is applied over the conductive layer. The photoresist material patterns the conductive layer for creation of a gate region on the body region 404 and a field-plate on a portion of drift region 402 of the fin 204. FIG. 10 shows a cross-sectional view of the conductive layer 1002 and the photoresist material 1004 applied to the fin 204. In block 122, the conductive layer is etched to form the gate region on the body region 404 and the field-plate on a portion of drift region 402 of the fin 204. FIG. 11 shows a cross-sectional view of the gate region 1102A formed on the body region 404 and the field-plate 1102B on a portion of drift region 402 of the fin 204 by etching the conductive layer 1002. FIG. 11 also shows the substrate 202 and the RESURF layer 206 disposed below the fin 204

Figure 12:
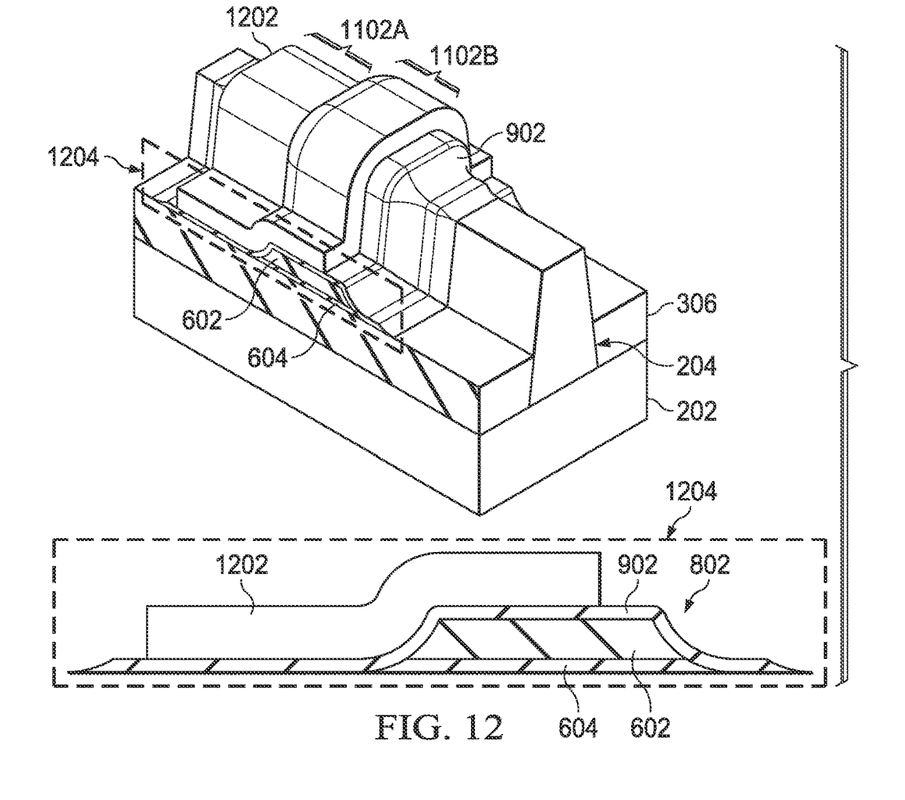
FIG. 12 shows a perspective view of the example fin with a gate region formed on three sides of the fin.
Figure 13:
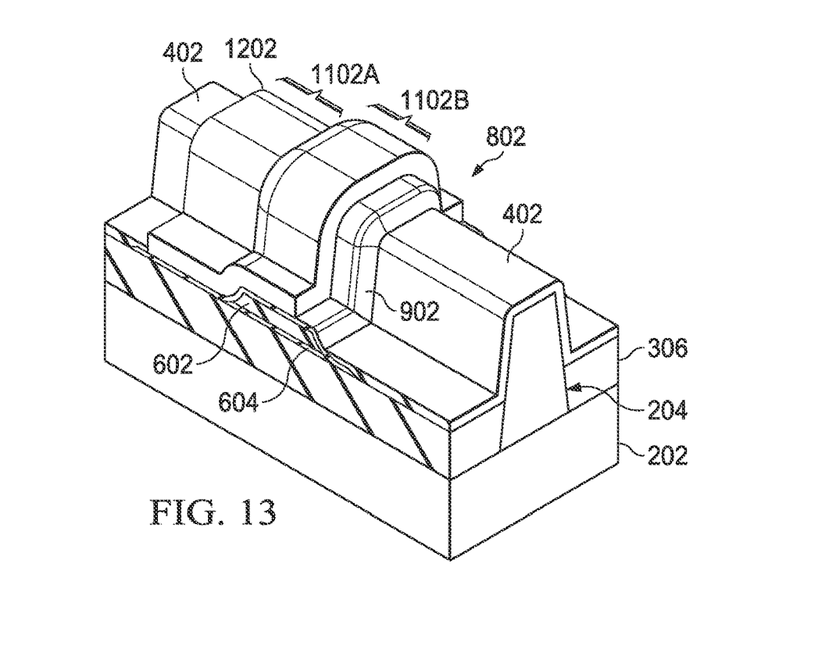
FIG. 13 shows another perspective view of an example fin with a gate region formed on three sides of the fin.

FIG. 12 shows a perspective view of the example fin 204 with a gate region 1202 formed on three sides of the fin 204. The gate region 1202 is thus formed over the field-plating 802 and over the body region 404 of the fin 402. In FIG. 12, the perspective view includes a cut-away 1204 that demonstrates a cross-sectional view of the field-plating dielectric 802. The field-plating dielectric 802 is demonstrated as including the first oxide layer 604, the high-K material layer 602, and the second oxide layer 902. The field plating dielectric 802, and thus the first oxide layer 604, the high-K material layer 602, and the second oxide layer 902, are arranged to cover the three sides (side 804, side 806, and side 808) of the drift region 402. FIG. 13 shows another perspective view of the gate region 1102A and the field-plate 1102B formed on the fin 204. In block 124, a drain region is formed adjacent the drift region 402, and source region is formed adjacent the body region 404. For example, in a NMOS FinFET, a P-type dopant is implanted in the body region 404, and an N-type dopant is implanted in the source region 408 and the drain region 406.

In block 126, back end of line (BEOL) processing is performed. For example, metal terminals and/or routing traces are added to the source region 408, the drain region 406, and the gate region 902.

For purposes of simplification of explanation, the terms "overly", "overlying", "underly" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An integrated circuit (IC), comprising:
a fin field effect transistor (FinFET) including:
 a substrate with a fin extending from a surface of the substrate, the fin having:
  a source region;
  a drain region;
  a drift region adjacent the drain region; and
  a body region extending between the drift region and the source region; and
 a field-plating (FP) dielectric layer on a first side, a second side, and a third side of the drift region, wherein the FP dielectric layer includes:
  a first oxide material layer on the first side, the second side, and the third side of the drift region; and
  a high-K material layer on the first oxide material layer.

2. The IC of claim 1, wherein the FP dielectric layer further comprises:
a second oxide material layer on the high-K material layer, wherein the second oxide material layer extends over the body region.

3. The IC of claim 2, wherein the second oxide material layer is disposed on a first side, a second side, and a third side of the body region.

4. The IC of claim 2, further comprising:
a first conductive layer on the second oxide material layer, the first conductive layer over a first side, a second side, and a third side of the body region.

5. The IC of claim 4, further comprising:
a second conductive layer on the FP dielectric layer and at least over a portion of the first side, at least over a portion of the second side, and at least over a portion of the third side of the drift region.

6. The IC of claim 2, further comprising:
a contiguous conductive layer forming a gate over the second oxide material layer on the body region and a field plate over the FP dielectric layer on the drift region.

7. The IC of claim 5, wherein the first and second conductive layers include polysilicon.

8. The IC of claim 5, wherein:
the first conductive layer forms a gate of the FinFET; and
the second conductive layer forms a field plate of the FinFET, wherein the first conductive layer is connected to the second conductive layer.

9. The IC of claim 8, wherein a transition region between the first and second conductive layers has a smooth corner.

10. The IC of claim 1, further comprising:
a reduced surface field (RESURF) layer disposed below the drift region of the fin.

11. An integrated circuit (IC), comprising:
a fin field effect transistor (FinFET) including:
 a substrate;
 a fin extending from a surface of the substrate, the fin having:
  a source region;
  a drain region;
  a drift region adjacent the drain region; and
  a body region adjacent to the drift region and the source region;
 a field-plating (FP) dielectric layer on a first side, a second side, and a third side of the drift region, the FP dielectric layer comprising a high-K material; and
 an oxide material layer on a first side, a second side, and a third side of the body region.

12. The IC of claim 11, wherein the FP dielectric layer further comprises:
a high-K material layer comprising the high-K material; and
the oxide material layer.

13. The IC of claim 12, wherein the oxide material layer is a first oxide material layer, the FP dielectric layer comprises:
a second oxide material layer on the first side, the second side, and the third side of the drift region, wherein:
 the high-K material layer is disposed on the second oxide material layer; and
 the first oxide material layer is disposed on the high-K material layer.

14. The IC of claim 11, further comprising a polysilicon gate formed over the FP dielectric layer and the oxide material layer.

15. The IC of claim 11, further comprising:
a first conductive layer on the oxide material layer.

16. The IC of claim 15, further comprising:
a second conductive layer on the FP dielectric layer.

17. The IC of claim 16, wherein the first and second conductive layers include polysilicon.

18. The IC of claim 16, wherein:
the first conductive layer forms a gate of the FinFET; and
the second conductive layer forms a field plate of the FinFET, wherein the first conductive layer is connected to the second conductive layer.

19. The IC of claim 18, wherein a transition region between the first and second conductive layers has a smooth corner.

20. The IC of claim 11, further comprising:
a reduced surface field (RESURF) layer disposed below the drift region of the fin.

21. The IC of claim 11, further comprising:
a contiguous conductive layer forming a gate over the oxide material layer over the body region and a field plate over the FP dielectric layer over the drift region.

* * * * *